United States Patent [19]

Sakamoto et al.

[11] Patent Number: 4,732,733
[45] Date of Patent: Mar. 22, 1988

[54] COPPER-BASE ALLOYS FOR LEADFRAMES

[75] Inventors: Daiji Sakamoto, Yonago; Rikizo Watanabe, Yasugi, both of Japan

[73] Assignee: Hitachi Metals, Ltd., Japan

[21] Appl. No.: 899,397

[22] Filed: Aug. 22, 1986

[30] Foreign Application Priority Data

Sep. 2, 1985 [JP] Japan .................................. 60-193407

[51] Int. Cl.$^4$ ............................................... C22C 9/06
[52] U.S. Cl. ..................................... 420/485; 420/487; 420/492; 420/493; 420/494; 428/620; 357/67; 357/70
[58] Field of Search ............... 420/481, 482, 485, 487, 420/492, 494; 108/434, 435; 428/596; 357/67, 70

[56] References Cited

U.S. PATENT DOCUMENTS

| 4,337,089 | 6/1982 | Arita et al. | 420/472 |
| 4,366,117 | 12/1982 | Tsuji | 420/481 |
| 4,612,167 | 9/1986 | Watanabe et al. | 420/481 |

Primary Examiner—L. Dewayne Rutledge
Assistant Examiner—George Wyszomierski
Attorney, Agent, or Firm—Antonelli, Terry & Wands

[57] ABSTRACT

A copper-base alloy for leadframes consisting essentially of 0.8–4.0 weight % of Ni, 0.2–4.0 weight % of Ti and 0.05–0.6 weight % of Mg, the balance being essentially Cu and inevitable impurities, and a ratio of Ni to Ti being 1–4. This copper-base alloy has high mechanical strength of about 50 kgf/mm$^2$ or more and electric conductivity of 30% IACS or more as well as good solderability and solder durability. Thus, it may be used as a highly reliable material for leadframes of semiconductor devices.

7 Claims, 3 Drawing Figures

- Cu$_6$Sn$_5$ LAYER
- Cu$_3$Sn LAYER
- POROUS LAYER
- BASE METAL

10 μm

- Cu$_6$Sn$_5$ LAYER
- Cu$_3$Sn LAYER
- BASE METAL

10 μm

COPPER-BASE ALLOYS FOR LEADFRAMES

BACKGROUND OF THE INVENTION

The present invention relates to copper-base alloys for use mainly in leadframes of semiconductor devices.

Semiconductor chips having integrated circuits are usually connected to leadframes and packaged in molded resins with only leadframe terminals exposed, whereby IC devices are provided. Leadframe materials which may be used for such integrated circuit devices are, in general, required to have the following properties:

(1) Good electric and thermal conductivities

Since leadframes serve as electric conductors for supplying electric signals to the circuits, they should have good electric conductivity. Also, since heat generated in the circuits should be dissipated through the leadframes, they should have good thermal conductivity, too.

(2) High mechanical strength

When the leadframe terminals of semiconductor devices are inserted into sockets of circuit boards, misalignments of the terminals and the sockets may occur. Accordingly, the leadframe terminals should be tough enough not to be bent even when pressed under misaligned conditions. Further, they should have high resistance to fatigue by repeated bending.

(3) Good heat resistance (high softening temperature)

During the production of semiconductor devices, die bonding, wire bonding and resin molding are performed, exposing leadframes to high temperatures of 300°–450° C. Accordingly, leadframes must have good heat resistance, namely high softening temperatures so that they can maintain high mechanical strength even at such high temperatures.

(4) Coefficient of thermal expansion close to those of semiconductor chips and molded resin packages If there is large difference in coefficient of thermal expansion between leadframes and semiconductor chips and molded resin packages, distortions would occur during the assembling steps involving heating. Such distortions might cause the variations of semiconductor chips' characteristics and the deteriorations of the adhesion of the leadframes to resin packages. In order to prevent these problems, the leadframes should have thermal expansion coefficients as close as possible to those of the semiconductor chips and the molded resin packages.

(5) Good platability

Leadframes are plated with gold or silver on their surfaces which are subjected to die bonding with the semiconductor chips. Therefore, leadframes should have good affinity to platings. That is, platings should be strongly adhered to the leadframe surfaces and should have as small defects as possible.

(6) Good solderability

Leadframe terminals are coated with tin or soldered in advance to facilitate soldering thereof on the circuit boards. Accordingly, leadframes should have good solderability, namely they should be highly wettable with solders.

(7) Good solder durability

Semiconductor devices soldered on circuit boards should not deteriorate their characteristics during their entire life. In general, soldered portions are one of those vulnerable to deterioration. Therefore, the soldered portions of the leadframes should be able to withstand any possible environment in which semiconductor devices are used, without deteriorating the adhesion thereof to solder layers. Such property is called herein "solder durability."

(8) Good adhesion to molded resin packages

In general, most semiconductor integrated circuit devices are packaged with molded resins. Accordingly, leadframes are required to have good adhesion to molded resins.

Typical alloys conventionally used for leadframes are iron-nickel alloys such as Fe-42% Ni alloys and Fe-29% Ni-17% Co alloys, and copper base alloys such as Ni-containing copper alloys and phosphor bronze. These Fe-base alloys have excellent mechanical strength, but their electric and thermal conductivity is not always satisfactory. On the other hand, the copper-base alloys have good electric and thermal conductivity, and are much less expensive than the iron-nickel counterparts. However, they lack mechanical strength.

Nevertheless, because of their advantages of electric, thermal conductivity and cost, the copper-base alloys have recently been finding increasing wider use in leadframes. Thus, various attempts have been made to improve their mechanical strength, heat resistance and other properties.

U.S. Pat. No. 4,249,941 to R. Futatsuka, et al. discloses copper-base alloys for leadframes of integrated circuit devices consisting essentially of 0.5–1.5 weight % Fe, 0.5–1.5 weight % Sn, 0.01–0.35 weight % Sn, 0.01–0.35 weight % P and balance Cu and inevitable impurities. They are, however, not necessarily satisfactory in terms of mechanical strength and solder durability.

U.S. Pat. No. 4,337,089 to K. Arita, et al. discloses copper-nickel-tin alloys for leadframes containing 0.5–3.0 weight % Ni, 0.3–0.9 weight % Sn, 0.01–0.2 weight % P, 0–0.35 weight % Mn and/or Si, and balance Cu. These alloys have good tensile strength but relatively poor electric conductivity. In addition, they do not have sufficient solder durability.

There are some other copper-base alloys: Copper Alloy C 194 (2.35% Fe-0.03% P-0.12% Zn), Copper Alloy C 195 (1.5% Fe-0.1% P-0.8% Co-0.6% Sn), and Copper Alloy C 155 (0.06% P-0.07% Ag-0.11% Mg).

These copper-base alloys, however, do not necessarily have a preferable combination of good electric conductivity and high mechanical strength. That is, those having good mechanical strength have relatively poor electric conductivity and vice versa. And full attention has not been paid to solderability. For instance, some of alloy elements added to improve the alloy's mechanical strength largely tend to deteriorate its solder wettability and solder durability in a way or another. This extremely lowers reliability of semiconductor devices, and it may be detrimental particularly for applications in which the leadframes are somewhat exposed to high temperatures.

OBJECT AND SUMMARY OF THE INVENTION

An object of the present invention is, therefore, to provide a copper-base alloy for leadframes having a combination of good electric conductivity and high mechanical strength.

Another object of the present invention is to provide a copper-base alloy for leadframes having a combination of good electric conductivity and high mechanical strength as well as good solder durability.

Further object of the present invention is to provide a copper-base alloy satisfying the requirements for leadframe materials as listed above.

In view of the above objects, the inventors have conducted extensive research on the influences of various alloying elements on the properties of copper-base alloys. As a result, they have found that the addition of Ni and Ti in particular proportions provides copper-base alloys with high mechanical strength and electric conductivity, and further that the addition of Mg as a third alloying element in a particular proportion provides the Cu-base alloys with good solder durability.

That is, a copper-base alloy for leadframes according to the present invention consists essentially of 0.8-4.0 weight % of Ni, 0.2-4.0 weight % of Ti, 0.05-0.6 weight % of Mg, the balance being essentially Cu and inevitable impurities, and a ratio of Ni to Ti being 1-4. This Cu-base alloy may further contain Mn and/or Zn in a total amount of 0.1-1.0 weight %.

DESCRIPTION OF THE PREFERRED EMBODIMENTS

Figure 1:
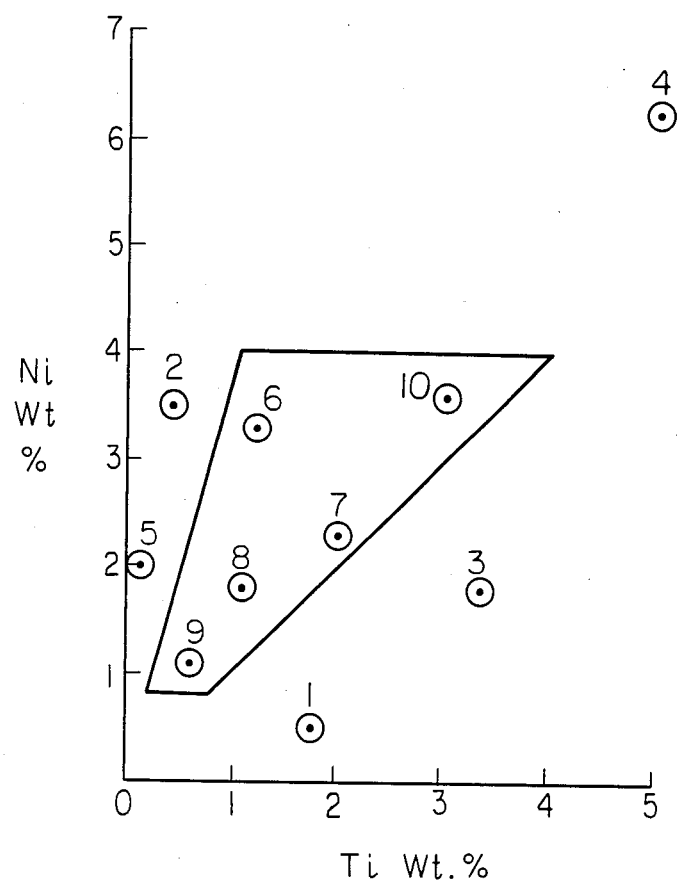
FIG. 1 is a graph showing the amounts of Ni and Ti in the alloys of Example 1.

Ni and Ti, when added to copper, tend to precipitate as fine particles of $Ni_3Ti$ or NiTi in the Cu matrix, enhancing mechanical strength and heat resistance thereof without substantially deteriorating electric conductivity of the alloy. When Ni is less than 0.8 weight % or when Ti is less than 0.2 weight %, sufficient improvement in mechanical strength of the alloy cannot be achieved. On the other hand, when either of Ni and Ti exceeds 4.0 weight %, the workability, platability and solderability of the alloy are deteriorated. Accordingly, Ni should be 0.8-4.0 weight %, and Ti should be 0.2-4.0 weight %. The preferred amounts of Ni and Ti added are 1.0-3.0 weight % and 0.5-1.5 weight %, respectively. It has been found that since uncombined Ni and Ti which form a solid solution with the copper matrix may reduce electric conductivity of the copper-base alloy, it is important to control the Ni/Ti ratio by weight within a proper range. When the Ni/Ti ratio by weight is less than 1, excess Ti remaining uncombined in the alloy seriously reduces the electric conductivity of the alloy. On the other hand, when the Ni/Ti ratio exceeds 4, excess Ni exists, forming a solid solution with the copper matrix so that the alloy's electric conductivity is also reduced. In view of the above, the Ni/Ti ratio by weight should be limited to 1-4.

Mg is an alloying element for improving the solder durability of the resulting alloy. However, it is not clear how Mg works to effect such improvement. It may be guessed that Mg inhibits elements dissolved in the copper matrix in small amounts from moving by diffusion up to an alloy surface to which solder is applied, thus preventing the formation of brittle intermetallic compounds of Ti and Ni with Sn on the boundary of the alloy matrix surface with the solder layer. When the Mg content is less than 0.05 weight %, sufficient effect cannot be obtained, and when it exceeds 0.6 weight %, a further effect cannot be expected and the alloy has a reduced electric conductivity. Therefore, the amount of Mg added should be limited to 0.05-0.6 weight %. The preferred amount of Mg is 0.05-0.4 weight %.

One of the most preferable alloy composition is that consisting essentially of about 2 weight % of Ni, about 1 weight % of Ti and about 0.2 weight % of Mg, the balance being essentially Cu and inevitable impurities and the ratio of Ni to Ti being about 2.

Mn and/or Zn may be added as deoxidizers without deteriorating the solder durability of the alloy. Each of Mn and Zn should be 0.1-1.0 weight %, and when they are added in combination, their total amount should also be 0.1-1.0 weight % because more than 1.0 weight % of Mn and Zn in total reduces the electric conductivity of the resulting alloy beyond a negligible level.

Further, the copper-base alloy according to the present invention may contain P in an amount of 0.05 weight or less, as commonly used as a deoxidizer in the melting of copper-base alloys. From the viewpoint of electric conductivity, however, P is desirably 0.02 weight % or less.

The copper-base alloys of the present invention may be formed into leadframes in a conventional way. Typically, alloying elements are melted together in a furnace at 1200°-1400° C., and cast into ingots of predetermined size. The above steps are preferably carried out in vacuum. The ingots are then hot rolled to reduce their thickness to about 2-5 mm. Before hot rolling, forging may be carried out, if necessary. Oxide scales on the sheet surfaces are removed by grinding. The polished sheets are then subjected to cold rolling. Because cold rolling hardens the alloy sheets, annealing is carried out before each cold rolling step, in order to soften the sheets. By repeating the cold rolling and the annealing, the sheets are made as thin as 0.1-0.5 mm. The reduction ratio of cold rolling may be 50-90 %, and the final cold rolling step has preferably 30-90 % of reduction ratio. The sheets are finally aged at 400°-600° C. for one minute - 5 hours. The finished sheets are blanked into leadframes of the desired shapes by punching press Leadframes may be partially plated with Ag or Au. Semiconductor chips are bonded onto the leadframes, which is called die bonding. Then, wire bonding is conducted to connect the electrodes of integrated circuits on the semiconductor chips to the predetermined portions of the leadframes. They are packaged with molded resins in such a manner that only leadframe terminals project from the resin moldings. The leadframe terminals may be plated with tin or coated with solders.

The present invention will be explained in further detail referring to the following Examples.

EXAMPLE 1

This Example shows the significance of limitations of Ni and Ti contents as well as a ratio of Ni to Ti.

Alloys having the compositions as shown in Table 1 were melted in a high-frequency induction furnace, cast and forged, and then subjected to hot rolling to form 5 mm-thick strips. Each strip was ground to remove oxide scales from both surfaces thereof. The strip was then subjected to cold rolling and annealing repeatedly. The reduction rate of the final cold rolling step was 50%, resulting in a 0.25 mm-thick sheet. The Sheet was finally subjected to an aging treatment at 450 ° C. for one hour.

The alloy sheets thus prepared were measured with respect to electric conductivity and tensile strength. The results are shown in Table 1.

TABLE 1

| No. | Composition (wt. %) | | | Ni/Ti | Electric Conductivity (% IACS*) | Tensile Strength (kgf/mm²) |
|---|---|---|---|---|---|---|
| | Ni | Ti | Cu | | | |
| 1 | 0.5 | 1.8 | Bal | 0.3 | 20 | 64 |
| 2 | 3.5 | 0.4 | " | 8.8 | 23 | 37 |
| 3 | 1.8 | 3.4 | " | 0.5 | 24 | 69 |
| 4 | 6.3 | 5.0 | " | 1.3 | 27 | 71 |
| 5 | 2.0 | 0.1 | " | 20 | 25 | 30 |
| 6 | 3.3 | 1.2 | " | 2.8 | 57 | 57 |
| 7 | 2.3 | 2.0 | " | 1.2 | 44 | 63 |
| 8 | 1.8 | 1.1 | " | 1.6 | 49 | 56 |
| 9 | 1.1 | 0.6 | " | 1.8 | 51 | 53 |
| 10 | 3.6 | 3.0 | " | 1.2 | 35 | 65 |

*Note: International Annealed Copper Standard

With respect to the alloys shown in Table 1 (Nos. 1–10), their Ni and Ti contents and Ni/Ti ratios are shown in FIG. 1. It is evident from FIG. 1 that the alloys satisfying the conditions of 0.8–4.0 weight % Ni, 0.2–4.0 weight % Ti and the Ni/Ti ratio of 1–4, which are enclosed by a quadrilateral as shown by the solid lines, have electric conductivity of 30% IACS or more and tensile strength of 50kgf/mm² or more.

EXAMPLE 2

Alloys of the compositions as shown in Table 2 were formed into 0.25 mm-thick sheets in the same manner as in Example 1. With respect to each alloy sheet, electric conductivity, tensile strength, solder wettability and solder durability were measured. Specifically speaking; the solder wettability was measured by dipping each sample sheet of 0.25mm in thickness, 20mm in width and 30mm in length in a molten 60Sn-40Pb solder according to MIL-STD-202F METHOD 208D, and observing with the eye whether or not the sample sheet was covered at least 95% by a continuous solder coating. The solder durability was determined by keeping the sample sheet soldered according to the above method in the atmosphere of 150° C. for 500 hours, bending it at a radius of curvature of 2mm, stretching it straight and observing whether or not the solder was peeled from the leadframe surface. The results are shown in Table 2. Incidentally, conventional alloys listed in Table 2 are as follows: sample No. 30=a Ni-containing copper alloy; sample No. 31=a high strength copper alloy in the group of phosphor bronze and sample No. 32=a 42-Ni alloy.

TABLE 2

| No.* | Composition (wt. %) | | | | | | Ni/Ti | Electric Conductivity (% IACS) | Tensile Strength (kgf/mm²) | Solder Wettability | Solder Durability |
|---|---|---|---|---|---|---|---|---|---|---|---|
| | Ni | Ti | Mg | Mn | Zn | Cu | | | | | |
| 1 | 0.5 | 1.8 | — | — | — | Bal | 0.3 | 20 | 64 | Good | Completely Peeled |
| 5 | 2.0 | 0.1 | — | — | — | " | 20 | 25 | 30 | " | Partially Peeled |
| 8 | 1.8 | 1.1 | — | — | — | " | 1.6 | 49 | 56 | " | Completely Peeled |
| 20 | 2.7 | 0.8 | 0.09 | — | — | " | 3.4 | 45 | 53 | " | Not Peeled |
| 21 | 3.1 | 1.2 | 0.45 | — | — | " | 2.6 | 40 | 55 | " | " |
| 22 | 2.0 | 0.9 | 0.13 | — | — | " | 2.2 | 53 | 62 | " | " |
| 23 | 2.0 | 1.0 | 0.23 | — | — | " | 2.0 | 46 | 71 | " | " |
| 24 | 1.3 | 0.8 | 0.07 | — | — | " | 1.6 | 43 | 64 | " | " |
| 25 | 1.9 | 0.7 | 0.07 | 0.14 | — | " | 2.7 | 42 | 56 | " | " |
| 26 | 2.0 | 1.1 | 0.29 | 0.52 | — | " | 1.8 | 39 | 62 | " | " |
| 27 | 1.9 | 0.8 | 0.22 | — | 0.41 | " | 2.4 | 42 | 60 | " | " |
| 28 | 2.2 | 1.2 | 0.19 | 0.20 | 0.23 | " | 1.8 | 41 | 63 | " | " |
| 29 | 1.5 | 0.9 | 0.26 | 0.43 | 0.20 | " | 1.7 | 40 | 63 | " | " |
| 30 | 9.0Ni—2.3Sn—bal Cu | | | | | | — | 12 | 56 | " | Partially Peeled |
| 31 | 4.0Sn—0.20P—bal Cu | | | | | | — | 20 | 60 | " | " |
| 32 | 41Ni—bal Fe | | | | | | — | 3 | 65 | " | Not Peeled |

Note *Sample Nos. 1, 5 and 8 are Comparative Examples, sample Nos. 20–29 are alloys according to the present invention and sample Nos. 30–32 are conventional alloys.

It is evident from Table 2 that the Ni-Ti-Mg-Cu alloys according to the present invention (smaple Nos. 2029) have high electric conductivity of 30% IACS or more and high tensile strength of about 50 kgf/mm² or more as well as good solder wettability and solder durability. Thus, they are highly suitable as reliable materials for leadframes.

EXAMPLE 3

Figure 2A:
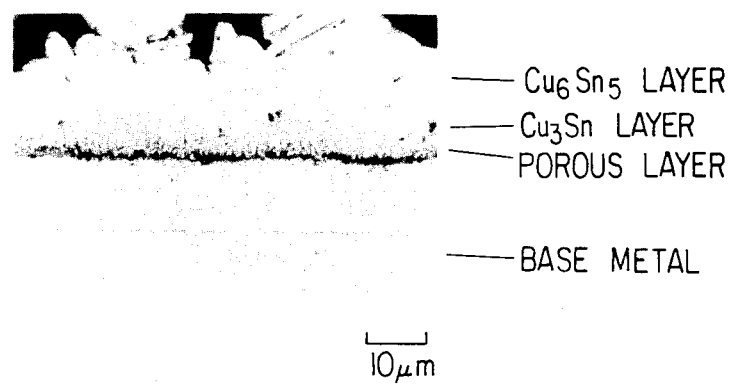
FIGS. 2(a) and 2(b) are respectively photomicrographs of the cross-sections of soldered alloys after a solder durability test.
Figure 2B:
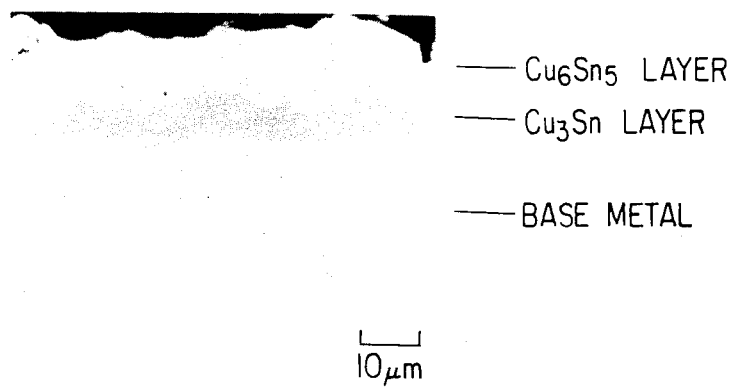

Alloy Nos. 8 and 23 (Table 2), after the solder durability test, were examined by taking photomicrographs of the cross-sections of soldered portions thereof. The photomicrographs as shown in FIGS. 2(a) and 2(b) were 1000 times in magnification. Since the soldered alloys were kept at 150° C. for 500 hours, Cu in the alloys appeared to have diffused into the solders, thereby causing the reaction of Sn with Cu in the alloys to form intermetallic compounds such as $Cu_3Sn$, $Cu_6Sn_5$, etc. on the solder-base metal boundary. In the case of Alloy No. 8 containing no magnesium, a porous intermetallic compound layer consisting essentially of Ni, Ti, Sn and Cu was formed between the base metal and the $Cu_3Sn$ layer as shown in FIG. 2(a). The peeling of the solder layer may occur from this porous intermetallic compound layer. On the other hand, in the case of Alloy No. 23 containing Mg, such a porous intermetallic compound layer was not formed, thus preventing the peeling of the solder layer from the base metal or alloy substrate.

As mentioned above, Ni and Ti in amounts satisfying the requirements of 0.8–4.0 weight % Ni and 0.2–4.0 weight % Ti as well as the Ni/Ti ratio of 1–4 provide copper-base alloys with high electric conductivity and mechanical strength, and Mg in an amount of 0.05–0.6 weight % serves to improve the solder durability of the copper-base alloys. And Mn and Zn serve to deoxidize the copper-base alloys without deteriorating their solder durability as long as their total amount is within the range of 0.1–1.0 weight %.

The alloy of the present invention has more than 10 times as high electric conductivity as conventional 42-Ni alloys, and it is almost on the same level as high strength copper alloys containing Ni, Sn and/or P in mechanical strength and superior to the latter with respect to electric conductivity and solder durability.

Since the alloy of the present invention has high mechanical strength and electric conductivity as well as good solder durability, it may be used as an extremely reliable material for leadframes.

The present invention has been explained above by means of Examples, but it should be noted that the present invention is not limited thereto, and that any changes and modifications are possible unless they deviate from the spirit and scope of the present invention which is defined by the claims attached hereto.

What is claimed is:

1. A copper-base alloy for leadframes consisting essentially of 0.8–4.0 weight % of Ni, 0.2–4.0 weight % of Ti and 0.05–0.6 weight % of Mg, the balance being essentially Cu and inevitable impurities, and a ratio of Ni to Ti being 1–4.

2. A copper-base alloy for leadframes consisting essentially of 0.8–4.0 weight % of Ni, 0.2–4.0 weight % of Ti, 0.05–0.6 weight % of Mg and 0.1–1.0 weight % of Mn in total, the balance being essentially Cu and inevitable impurities, and a ratio of Ni to Ti being 1–4.

3. The copper-base alloy for leadframes according to claim 1, wherein Ni is 1.0–3.0 weight %, Ti is 0.5–1.5 weight % and Mg is 0.05–0.40 weight %.

4. The copper-base alloy for leadframes according to claim 2, wherein Ni is 1.0–3.0 weight %, Ti is 0.5–1.5 weight % and Mg is 0.05–0.40 weight %.

5. The copper-base alloy for leadframes according to claim 1, wherein Ni is about 2 weight %, Ti is about 1 weight % and Mg is about 0.2 weight %, the balance being essentially Cu and inevitable impurities, and the ratio of Ni to Ti being about 2.

6. A leadframe for use in semiconductor devices, said leadframe being made of a copper-base alloy consisting essentially of 0.8–4.0 weight % of Ni, 0.2–4.0 weight % of Ti and 0.05–0.6 weight % of Mg, the balance being essentially Cu and inevitable impurities, and a ratio of Ni to Ti being 1–4.

7. A leadframe for use in semiconductor devices, said leadframe being made of a copper-base alloy consisting essentially of 0.8–4.0 weight % of Ni, 0.2–4.0 weight % of Ti, 0.05–0.6 weight % of Mg and 0.1–1.0 weight % of Mn in total, the balance being essentially Cu and inevitable impurities, and a ratio of Ni to Ti being 1–4.

* * * * *